(12) United States Patent
Ahn

(10) Patent No.: US 9,767,906 B2
(45) Date of Patent: Sep. 19, 2017

(54) SEMICONDUCTOR MEMORY DEVICE INCLUDING THREE-DIMENSIONAL ARRAY STRUCTURE AND MEMORY SYSTEM INCLUDING THE SAME

(71) Applicant: SK hynix Inc., Icheon-si, Gyeonggi-do (KR)

(72) Inventor: Jung Ryul Ahn, Namyangju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/040,099

(22) Filed: Feb. 10, 2016

(65) Prior Publication Data
US 2017/0092363 A1  Mar. 30, 2017

(30) Foreign Application Priority Data
Sep. 24, 2015 (KR) .................. 10-2015-0135868

(51) Int. Cl.
*G11C 16/04* (2006.01)

(52) U.S. Cl.
CPC ............... *G11C 16/0483* (2013.01)

(58) Field of Classification Search
CPC ................................. G11C 16/0483
USPC .................................. 365/185.03
See application file for complete search history.

(56) References Cited

U.S. PATENT DOCUMENTS

| 7,924,622 | B2 * | 4/2011 | Lee | G11C 16/0483 365/185.17 |
| 9,286,994 | B1 * | 3/2016 | Chen | G11C 16/08 |
| 9,318,206 | B2 * | 4/2016 | Dong | G11C 16/14 |
| 2007/0159886 | A1 * | 7/2007 | Kang | G11C 16/0483 365/185.17 |
| 2009/0244967 | A1 * | 10/2009 | Kim | G11C 11/5642 365/185.2 |
| 2012/0300547 | A1 * | 11/2012 | Choi | H01L 27/11565 365/185.05 |
| 2013/0294168 | A1 * | 11/2013 | Shirakawa | G11C 29/50004 365/185.17 |

(Continued)

OTHER PUBLICATIONS

Ishiduki, M. et al., "Optimal device structure for pipe-shaped BiCS flash memory for ultra high density storage device with excellent performance and reliability", (Toshiba). IEDM, Dec. 2009.*

*Primary Examiner* — Anthan Tran
*Assistant Examiner* — Mushfique Siddique
(74) *Attorney, Agent, or Firm* — William Park & Associates Ltd.

(57) ABSTRACT

A semiconductor memory device may include first and second sub-cell strings. The first sub-cell string may be coupled to a common source line at an end of the first sub-cell string. The first sub-cell string may have a first group of normal memory cells and at least one source-side middle dummy memory cell coupled to the first sub-cell string and the first group of the normal memory cells. The second sub-cell string may be coupled to a bit line at an end of the second sub-cell string. The second sub-cell string may have a second group of normal memory cells and drain-side middle dummy memory cells coupled to the second group the normal memory cells. The number of the drain-side middle dummy memory cells may be greater than the number of the at least one source-side middle dummy memory cell.

19 Claims, 8 Drawing Sheets

(56) References Cited

U.S. PATENT DOCUMENTS

| | | | |
|---|---|---|---|
| 2014/0085983 A1* | 3/2014 | Hosono | G11C 16/0408 365/185.17 |
| 2014/0334232 A1* | 11/2014 | Nam | G11C 16/16 365/185.17 |
| 2014/0347921 A1* | 11/2014 | Shim | G11C 16/3427 365/185.02 |
| 2015/0009758 A1* | 1/2015 | Jang | G11C 16/24 365/185.17 |
| 2015/0063033 A1* | 3/2015 | Dong | G11C 16/0483 365/185.17 |
| 2015/0179266 A1* | 6/2015 | Park | G11C 16/10 365/185.2 |
| 2015/0221385 A1* | 8/2015 | Ahn | G11C 16/10 365/185.2 |
| 2015/0228352 A1* | 8/2015 | Choi | G11C 29/76 365/185.2 |
| 2015/0332773 A1* | 11/2015 | Kwak | G11C 16/10 365/185.11 |
| 2016/0005466 A1* | 1/2016 | Ahn | G11C 16/0483 365/185.11 |
| 2016/0012893 A1* | 1/2016 | Ahn | G11C 16/0483 365/185.2 |
| 2016/0055911 A1* | 2/2016 | Nguyen | G11C 16/10 365/185.17 |
| 2016/0093384 A1* | 3/2016 | Lee | G11C 16/24 365/185.12 |
| 2016/0099060 A1* | 4/2016 | Yoo | G11C 16/10 365/185.11 |
| 2016/0125944 A1* | 5/2016 | Shim | G11C 16/10 365/185.17 |
| 2016/0141043 A1* | 5/2016 | Lee | G11C 16/16 365/185.11 |
| 2016/0196877 A1* | 7/2016 | Ahn | G11C 16/0483 257/401 |

* cited by examiner

FIG. 5

| ROW LINE | VOLTAGE |
|---|---|
| DSL1_1 (unselected) | Vdsl1 |
| DSL1_2 (unselected) | Vdsl2 |
| DSL2_1 (selected) | Vdsl3 |
| DSL2_2 (selected) | |
| DDL3 | Vdwl5 |
| DDL2 | Vdwl4 |
| DDL1 | Vdwl3 |
| NWLs | Vpgm |
| NWLus | Vpass |
| DML1~DML3 | |
| SML | |
| SDL2 | Vdwl2 |
| SDL1 | Vdwl1 |
| SSL1 | Vssl1 |
| SSL2 | Vssl2 |

SEMICONDUCTOR MEMORY DEVICE INCLUDING THREE-DIMENSIONAL ARRAY STRUCTURE AND MEMORY SYSTEM INCLUDING THE SAME

CROSS-REFERENCE TO RELATED APPLICATION

The present application claims priority to Korean patent application number 10-2015-0135868 filed on Sep. 24, 2015, in the Korean Intellectual Property Office, the entire disclosure of which is incorporated by reference herein.

BACKGROUND

1. Technical Field

An aspect of the present disclosure relates to an electronic device, and more particularly to a semiconductor memory device including a three-dimensional array structure and a memory system including the same.

2. Related Art

A semiconductor memory device is a data storage device implemented on a semiconductor integrated circuit. The semiconductor memory device is generally classified into a volatile memory device and a nonvolatile memory device.

The volatile memory is a memory device that loses stored data when a power supply is cut off. Examples of the volatile memory include a static random access memory (SRAM), a dynamic RAM (DRAM), a synchronous DRAM (SDRAM), and the like. The nonvolatile memory is a memory device that retains stored data even when a power supply is cut off. Examples of the nonvolatile memory include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is generally classified into a NOR type flash memory and a NAND type flash memory.

BRIEF DESCRIPTION OF THE DRAWINGS

FIG. 5 is a table illustrating examples of voltages applied to row lines coupled to a selected memory block in a program operation of the semiconductor memory device.

DETAILED DESCRIPTION

Figure 1:
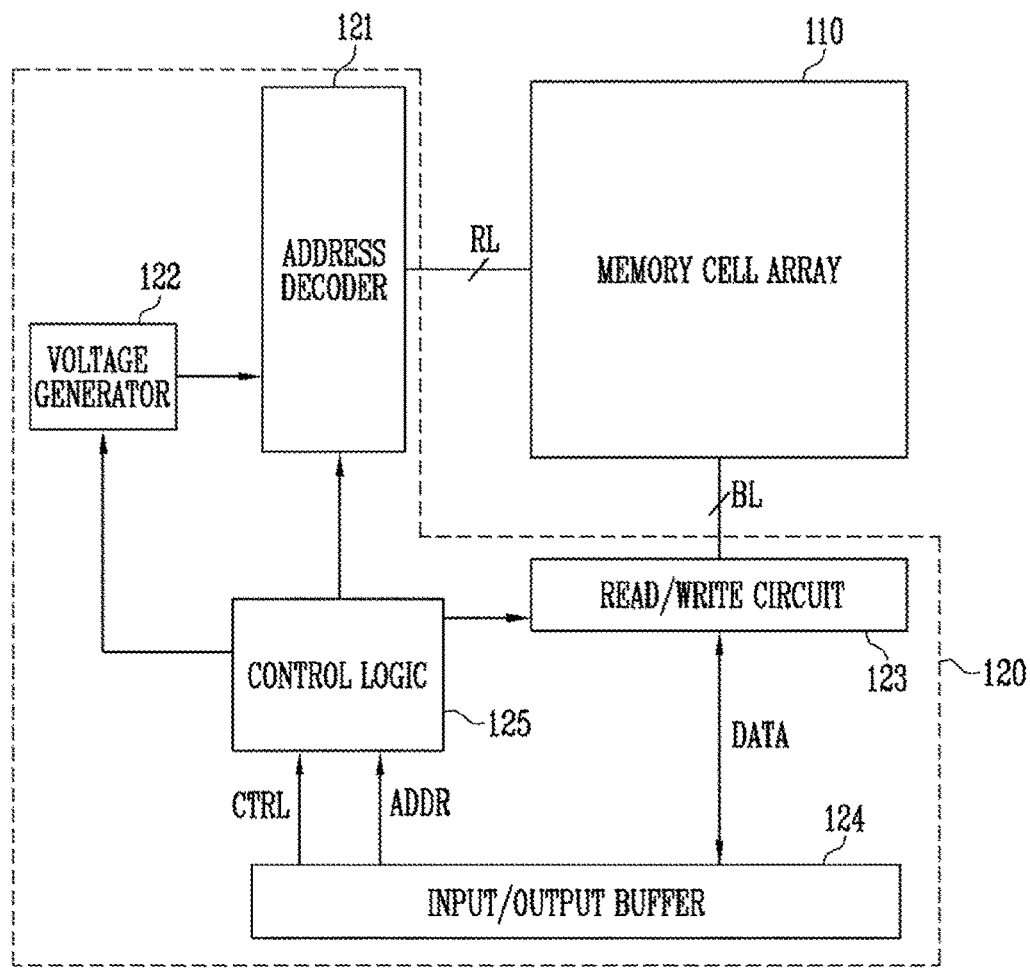
FIG. 1 is a diagram illustrating an example of a semiconductor memory device.

Embodiments provide a semiconductor memory device having improved reliability.

According to an embodiment of the present disclosure, a semiconductor memory device may include a first sub-cell string extending between the pipe transistor and coupled to a common source line at an end of the first sub-cell string, the first sub-cell string having a first group of normal memory cells and at least one source-side middle dummy memory cell coupled to the first group of the normal memory cells, and a second sub-cell string coupled to a bit line at an end of the second sub-cell string, the second sub-cell string having a second group of normal memory cells and drain-side middle dummy memory cells coupled to the second group of the normal memory cells. The number of the drain-side middle dummy memory cells is greater than the number of the at least one source-side middle dummy memory cell. The semiconductor memory device may also include a pipe transistor coupling the other end of the first sub-cell string and the other end of the second sub-cell string.

The number of the normal memory cells of the first group may be greater than the number of the normal memory cells of the second group.

If the first and second sub-cell strings are vertical strings, the height of the first sub-cell string from the pipe transistor may be equal to the height of the second sub-cell string from the pipe transistor.

If the first and second sub-cell strings are vertical strings, at least one of the drain-side middle dummy memory cells may be placed at the same or substantially the same height as at least one of the normal memory cells of the first group.

If the first and second sub-cell strings are vertical strings, the at least one source-side middle dummy memory cell may be placed at the same or substantially the same height as any one of the drain-side middle dummy memory cells.

The normal memory cells of the first group may include first normal memory cells coupled in series and second normal memory cells coupled in series. The at least one source-side middle dummy memory cell may be coupled in series between the first normal memory cells and the second normal memory cells. The normal memory cells of the second group may include third normal memory cells coupled in series and fourth normal memory cells coupled in series. The drain-side middle dummy memory cells may be coupled in series between the third normal memory cells and the fourth normal memory cells.

The first normal memory cells may be coupled between the common source line and the at least one source-side middle dummy memory cell. The second normal memory cells may be coupled between the pipe transistor and the at least one source-side middle dummy memory cell. If the first and second sub-cell strings are vertical strings, at least one of the drain-side middle dummy memory cells may be placed at the same height or substantially the same as at least one of the first normal memory cells.

The first normal memory cells may be coupled between the common source line and the at least one source-side middle dummy memory cell. The second normal memory cells may be coupled between the pipe transistor and the at least one source-side middle dummy memory cell. If the first and second sub-cell strings are vertical strings, at least one of the drain-side middle dummy memory cells may be placed at the same or substantially the same height as at least one of the second normal memory cells.

The first sub-cell string may further include source select transistors coupled to the common source line and source-side dummy memory cells coupled between the source select transistors and the normal memory cells of the first group. The second sub-cell string may further include drain select transistors coupled to the bit line and drain-side dummy memory cells coupled between the drain select transistors and the normal memory cells of the second group.

The number of the source-side dummy memory cells may be smaller than the number of the drain-side dummy memory cells. The number of the drain select transistors may be greater than the number of the source select transistors.

The number of the source-side dummy memory cells may be smaller by a predetermined value than the number of the drain-side dummy memory cells. The number of the drain select transistors may be greater than the predetermined value than the number of the source select transistors.

The number of the normal memory cells of the first group may be greater, than the number of the normal memory cells of the second group, by a value obtained by adding a difference between the number of the drain-side dummy memory cells and the number of the source-side dummy memory cells, a difference between the number of the drain select transistors and the number of the source select transistors, and a difference between the number of the drain-side middle dummy memory cells and the number of the at least one source-side middle dummy memory cell.

The sum of the number of the source select transistors, the number of the source-side dummy memory cells, the number of the normal memory cells of the first group, and the number of the source-side middle dummy memory cells may be equal to the sum of the number of the drain select transistors, the number of the drain-side dummy memory cells, the number of the normal memory cells of the second group, and the drain-side middle dummy memory cells.

According to an embodiment of the present disclosure, an memory system includes a controller and a semiconductor. The controller may provide control signals through a plurality of channels. The semiconductor memory device may include first and second sub-cell strings. The first sub-cell string may be coupled to a common source line and may have a first group of normal memory cells and at least one source-side middle dummy memory cell coupled to the first group of the normal memory cells. The second sub-cell string may be coupled to a bit line and may have a second group of normal memory cells and drain-side middle dummy memory cells coupled to the second group of the normal memory cells. The number of the drain-side middle dummy memory cells being greater than the number of the at least one source-side middle dummy memory cell.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

In the following detailed description, only certain example embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 is a diagram illustrating an example of a semiconductor memory device 100.

Referring to FIG. 1, the semiconductor memory device 100 may include a memory cell array 110 and a peripheral circuit 120.

The memory cell array 110 may be coupled to an address decoder 121 through row lines RL. The memory cell array 110 may be coupled to a read/write circuit 123 through bit lines BL.

The memory cell array 110 may include a plurality of memory blocks. Each of the plurality of memory blocks may include a plurality of cell strings. Each of the plurality of cell strings may include a plurality of memory cells disposed over a substrate. For example, each cell string may include vertically stacked memory cells disposed over the substrate. In an embodiment, the plurality of memory cells may be nonvolatile memory cells. In an embodiment, each of the plurality of memory cells may be defined as a single level cell or a multi-level cell. The memory cell array 110 will be described in detail with reference to FIGS. 2 to 4.

The peripheral circuit 120 may include the address decoder 121, a voltage generator 122, the read/write circuit 123, an input output buffer 124, and a control logic 125.

The address decoder 121 may be coupled to the memory cell array 110 through the row lines RL. The row lines RL may include drain select lines, dummy word lines, normal word lines, pipe lines, source select lines, and a common source line.

The address decoder 121 may select one or more row lines RL in response to control of the control logic 125. The address decoder 121 may receive an address ADDR from the control logic 125.

In an embodiment, program and read operations of the semiconductor memory device 100 may be performed on a page basis. In the program and read operations, the address ADDR may include a block address and a row address. The address decoder 121 may convert the received address ADDR into the block address by decoding the received address ADDR. The address decoder 121 may select a certain memory block according to the block address. The address decoder 121 may convert the received address ADDR into the row address by decoding the received address ADDR. The address decoder 121 may select one or more of drain select lines of the selected memory block and select one of a plurality of normal word lines of the selected memory block according to the row address. Accordingly, normal memory cells corresponding to one page may be selected.

In an embodiment, an erase operation of the semiconductor memory device 100 may be performed on a block basis. In the erase operation, the address ADDR may include a block address. The address decoder 121 may decode the address ADDR and convert it into the block address, and may select a certain memory block according to the block address.

In an embodiment, the address decoder 121 may include a block decoder, a row decoder, an address buffer, and the like.

The voltage generator 122 may operate in response to control of the control logic 125. The voltage generator 122 may generate an internal power voltage by using an external power voltage supplied to the semiconductor memory device 100. For example, the voltage generator 122 may generate an internal power voltage by regulating an external power voltage. The generated internal power voltage may be provided to the address decoder 121, the read/write circuit 123, the input/output buffer 124, and the control logic 125 to be used as an operation voltage of the semiconductor memory device 100.

The voltage generator 122 may generate a plurality of voltages by using at least one of the external power voltage and the internal power voltage. In an embodiment, the voltage generator 122 may include a plurality of pumping capacitors receiving the internal power voltage, selectively activate the plurality of pumping capacitors in response to control of the control logic 125, and generate a plurality of voltages. For example, the voltage generator 122 may generate various voltages applied to the row lines RL and provide the generated voltages to the address decoder 121. For example, the voltage generator 122 may generate voltages illustrated in FIG. 5.

The read/write circuit 123 may be coupled to the memory cell array 110 through the bit lines BL. The read/write circuit 123 may operate in response to control of the control logic 125.

In the program operation, the read/write circuit 123 may transmit data DATA from the input/output buffer 124 to the bit lines BL. The selected normal memory cells may be programmed according to the transmitted data DATA. In the read operation, the read/write circuit 123 may read data DATA from the selected normal memory cells through the bit lines BL and output the read data DATA to the input/output buffer 124. In the erase operation, the read/write circuit 123 may allow the bit lines BL to float.

In an embodiment, the read/write circuit 123 may include page buffers (e.g., page registers), a column select circuit, and the like.

The input/output buffer 124 may receive a control signal CTRL and an address ADDR from an external device and transmit the received control signal CTRL and address ADDR to the control logic 125. The input/output buffer 124 may transmit, to the read/write circuit 123, data DATA input from the external device in the program operation. The input/output buffer 124 may output, to the external device, data DATA received from the read/write circuit 123 in the read operation.

The control logic 125 may be coupled to the address decoder 121, the voltage generator 122, the read/write circuit 123, and the input/output buffer 124. The control logic 125 may receive a control signal CTRL and an address ADDR from the input/output buffer 124. The control logic 125 may control overall operations of the semiconductor memory device 100 in response to the control signal CTRL. The control logic 125 may transmit the address ADDR to the address decoder 121.

In an embodiment, the semiconductor memory device 100 may be a flash memory device.

Figure 2:
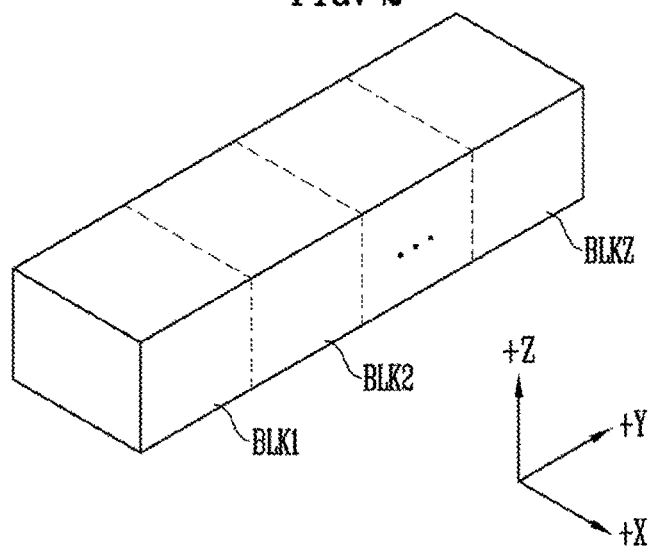
FIG. 2 is a diagram illustrating an example of an embodiment of a memory cell array of FIG. 1.

FIG. 2 is a diagram illustrating an example of an embodiment of the memory cell array 110 of FIG. 1.

Referring to FIG. 2, the memory cell array 110 may include a plurality of memory blocks BLK1 to BLKz. Each memory block may have a three-dimensional structure. For example, each memory block includes vertically stacked memory cells disposed over a substrate. The plurality of memory cells may be arranged along "+X," "+Y," and "+Z" directions. The structure of each memory block will be described in detail with reference to FIG. 3.

Figure 3:
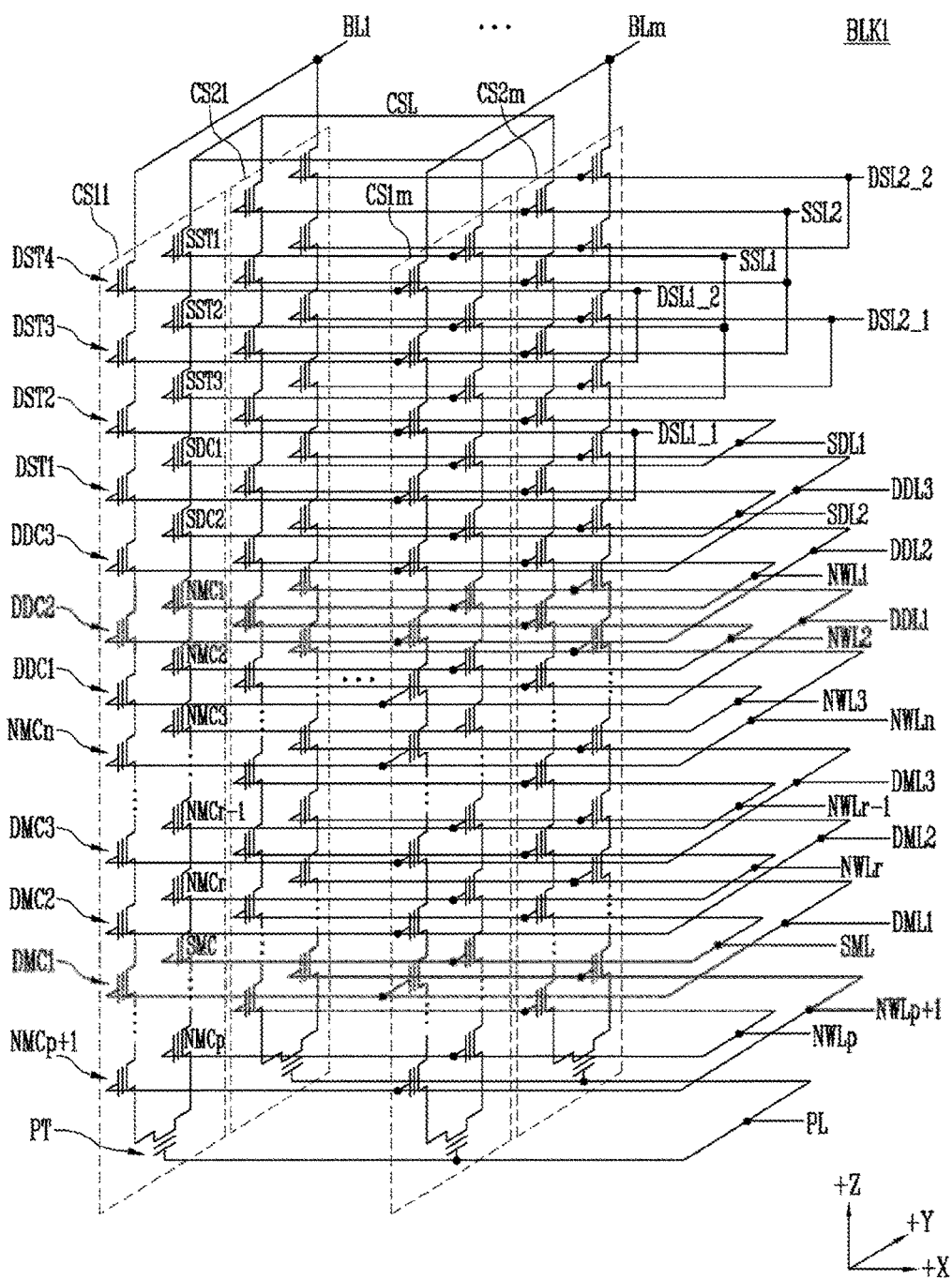
FIG. 3 is a diagram illustrating an example of memory blocks of FIG. 2.

FIG. 3 is a diagram illustrating an example of the memory blocks BLK1 to BLKz of FIG. 2.

Referring to FIG. 3, the first memory block BLK1 may include a plurality of cell strings CS11 to CS1$m$ and CS21 to CS2$m$. The plurality of cell strings CS11 to CS1$m$ and CS21 to CS2$m$ are formed in a 'U' shape over a substrate (not shown) at a lower portion of the memory block BLK1. In the first memory block BLK1, m cell strings are arranged in a row direction (e.g., "+X" direction). Although only two cell strings arranged in a column direction are illustrated in FIG. 3, it will be understood that two or more cell strings may be arranged in the column direction (e.g., "+Y" direction).

Each of the plurality of cell strings CS11 to CS1$m$ and CS21 to CS2$m$ may include first to third source select transistors SST1 to SST3, first and second source-side dummy memory cells SDC1 and SDC2, first to $n^{th}$ normal memory cells NMC1 to NMCn, at least one source-side middle dummy memory cell SMC, a pipe transistor PT, drain-side middle dummy memory cells DMC1 to DMC3, first to third drain-side dummy memory cells DDC1 to DDC3, and first to fourth drain select transistors DST1 to DST4.

The select transistors SST1 to SST3 and DST1 to DST4, the dummy memory cells SDC1, SDC2, SMC, DMC1 to DMC3, and DDC1 to DDC3, and the normal memory cells NMC1 to NMCn may have structures similar to each other. In an embodiment, each of the select transistors SST1 to SST3 and DST1 to DST4, the dummy memory cells SDC1, SDC2, SMC, DMC1 to DMC3, and DDC1 to DDC3, and the normal memory cells NMC1 to NMCn may include a channel layer, a tunneling insulating layer, a charge storage layer, and a blocking insulating layer.

The first to $n^{th}$ normal memory cells NMC1 to NMCn may store data transmitted through first to $m^{th}$ bit lines BL1 to BLm. The data stored in the first to $n^{th}$ normal memory cells NMC1 to NMCn may be read through the first to $m^{th}$ bit lines BL1 to BLm. The dummy memory cells SDC1, SDC2, SMC, DMC1 to DMC3, and DDC1 to DDC3 do not store data. The dummy memory cells SDC1, SDC2, SMC, DMC1 to DMC3, and DDC1 to DDC3 may be provided to reduce disturbances that can occur at normal memory cells adjacent to select transistors.

The source select transistors SST1 to SST3 of each cell string may be coupled in series between a common source line CSL and the source-side dummy memory cells SDC1 and SDC2.

In an embodiment, the first to third source select transistors SST1 to SST3 of one cell string may be coupled in common to one of source select lines. Source select transistors of cell strings arranged in the same row (e.g., "+X" direction) may be coupled to a source select line extending in the row direction. The source select transistors of the cell strings CS11 to CS1$m$ arranged in a first row may be coupled to a first source select line SSL1. The source select transistors of the cell strings CS21 to CS2m arranged in a second row may be coupled to a second source select line SSL2.

The source-side dummy memory cells SDC1 and SDC2 of each cell string may be coupled in series between the source select transistors SST1 to SST3 and normal memory cells NMC1 to NMCp. Gates of source-side dummy memory cells at the same height may be coupled to one source-side dummy word line. A gate of the first source-side dummy memory cell SDC1 may be coupled to a first source-side dummy word line SDL1. A gate of the second source-side dummy memory cell SDC2 may be coupled to a second source-side dummy word line SDL2.

The first to $n^{th}$ normal memory cells NMC1 to NMCn of each cell string may be coupled between the source-side dummy memory cells SDC1 and SDC2 and the drain-side dummy memory cells DDC1 to DDC3.

The first to $n^{th}$ normal memory cells NMC1 to NMCn may be divided into two groups. The first to $n^{th}$ normal memory cells NMC1 to NMCn may be divided into normal memory cells NMC1 to NMCp of a first group and normal memory cells NMCp+1 to NMCn of a second group. The normal memory cells NMC1 to NMCp of the first group and the normal memory cells NMCp+1 to NMCn of the second group may be coupled to one another through the pipe transistor PT.

The first to $p^{th}$ normal memory cells NMC1 to NMCp may be sequentially arranged in a direction opposite to the "+Z" direction, and may be coupled between the source-side dummy memory cells SDC1 and SDC2 and the pipe transistor PT. The $(p+1)^{th}$ to $n^{th}$ normal memory cells NMCp+1 to NMCn may be sequentially arranged in the "+Z" direction, and may be coupled between the pipe transistor PT and the drain-side dummy memory cells DDC1 to DDC3. Gates of the first to $n^{th}$ normal memory cells NMC1 to NMCn may be coupled to first to $n^{th}$ normal word lines NWL1 to NWLn, respectively.

A gate of the pipe transistor PT of each cell string may be coupled to a pipe line PL.

The drain-side dummy memory cells DDC1 to DDC3 of each cell string may be coupled in series between the drain select transistors DST1 to DST4 and the normal memory cells NMCp+1 to NMCn. Gates of drain-side dummy memory cells disposed at the same height may be coupled to the same drain-side dummy word line as one another. Gates of the first to third drain-side dummy memory cells DDC1 to DDC3 of each cell string may be coupled to first to third drain-side dummy word lines, respectively.

The dummy memory cells SDC1, SDC2, and DDC1 to DDC3 may reduce disturbances that can occur at normal memory cells adjacent to select transistors. For example, the source-side dummy memory cells SDC1 and SDC2 may reduce the electric field between the source select transistors SST1 to SST3 and the normal memory cells NMC1 to NMCp when the operations are performed on the cell string. For example, the drain-side dummy memory cells DDC1 to DDC3 may reduce the electric field between the drain select transistors DST1 to DST4 and the normal memory cells NMCp+1 to NMCn when the operations are performed on the cell string.

The first to fourth drain select transistors DST1 to DST4 of each cell string may be coupled in series between a corresponding bit line and the drain-side dummy memory cells DDC1 to DDC3. In an embodiment, as illustrated in FIG. 3, the first and second drain select transistors DST1 and DST2 of a cell string may be connected to a drain select line, and the third and fourth drain select transistors DST3 and DST4 of the cell string may be connected to another drain select line.

Cell strings arranged in the row direction may be coupled to drain select lines DSL1_1, DSL1_2, DSL2_1, and DSL2_2 extending in the row direction. The drain select transistors DST1 to DST4 of the cell strings CS11 to CS1m arranged in the first row may be coupled to first drain select lines DSL1_1 and DSL1_2. The first and second select transistors DST1 and DST2 in the cell strings CS11 to CS1m arranged in the first row may be coupled to the drain select line DSL1_1. The third and fourth drain select transistors DST3 and DST3 in the cell strings CS11 to CS1m arranged in the first row may be coupled to the drain select line DSL1_2. The drain select transistors DST1 to DST4 of the cell strings CS21 to CS2m arranged in the second row may be coupled to second drain select lines DSL2_1 and DSL2_2. The first and second drain select transistors DST1 and DST2 in the cell strings CS21 to CS2m arranged in the second row may be coupled to the drain select line DSL2_1. The third and fourth drain select transistors DST3 and DST4 in the cell strings CS21 to CS2m arranged in the second row may be coupled to the drain select line DSL2_2.

Each cell string may further include at least one source-side middle dummy memory cell SMC and drain-side middle dummy memory cells DMC1 to DMC3. According to an embodiment of the present disclosure, the number of the drain-side middle dummy memory cells DMC1 to DMC3 may be greater than the number of the source-side middle dummy memory cells SMC.

The at least one source-side middle dummy memory cell SMC may be coupled between the normal memory cells NMC1 to NMCp of the first group. In FIG. 3, the source-side middle dummy memory cell SMC may be coupled between first to $r^{th}$ normal memory cells NMC1 to NMCr (r is a natural number smaller than p) and $(r+1)^{th}$ to $p^{th}$ normal memory cells NMCr+1 to NMCp.

The drain-side middle dummy memory cells DMC1 to DMC3 may be coupled between the normal memory cells NMCp+1 to NMCn of the second group. In FIG. 3, the drain-side middle dummy memory cells DMC1 to DMC3 may be coupled in series between $(p+1)^{th}$ to $q^{th}$ normal memory cells NMCp+1 to NMCq (q is a natural number smaller than n and greater than p) and $(q+1)^{th}$ to $n^{th}$ normal memory cells NMCq+1 to NMCn.

In an embodiment, a pillar corresponding to the source select transistors SST1 to SST3, the source-side dummy memory cells SDC1 and SDC2, the first to $p^{th}$ normal memory cells NMC1 to NMCp, and the source-side middle dummy memory cell SMC may include two sub-pillars. For example, a first sub-pillar may extend in the "+Z" direction from the substrate, and a second sub-pillar may extend in the "+Z" direction from the first sub-pillar. The source-side middle dummy memory cell SMC may be provided in an area where the first and second sub-pillars adjoin each other. The source-side middle dummy memory cell SMC may be provided to improve electrical characteristics of the area where the first and second sub-pillars adjoin each other.

Similarly, a pillar corresponding to the drain select transistors DST1 to DST4, the drain-side dummy memory cell DDC1 to DDC3, the $(p+1)^{th}$ to $n^{th}$ normal memory cells NMCp+1 to NMCn, and the drain-side middle dummy memory cells DMC1 to DMC3 may include two sub-pillars. For example, the pillar may include a third sub-pillar extending in the "+Z" direction from the substrate and a fourth sub-pillar extending in the "+Z" direction from the third sub-pillar. The drain-side middle dummy memory cells DMC1 to DMC3 may be provided in an area where the third and fourth sub-pillars adjoin each other. The drain-side middle dummy memory cells DMC1 to DMC3 are provided to improve electrical characteristics of the area where the third and fourth sub-pillars adjoin each other.

In an embodiment, the memory block BLK1 may be divided into a plurality of sub-blocks, and an erase operation may be performed on a sub-block basis. For example, upper normal memory cells (e.g., NMC1 to NMCr and NMCq+1 to NMCn) of the memory block BLK1 may be included in one sub-block, and lower normal memory cells (e.g., NMCr+1 to NMCp and NMCp+1 to NMCq) of the memory block BLK1 may be included in another sub-block. The source-side middle dummy memory cell SMC and the drain-side middle dummy memory cells DMC1 to DMC3 may be provided in an area where the two sub-blocks adjoin each other. The middle dummy memory cells SMC and DMC1 to DMC3 may be provided to improve the reliability of the normal memory cells.

In addition, it will be understood that the middle dummy memory cells SMC and DMC1 to DMC3 may be disposed between the normal memory cells NMC1 to NMCn, and the exact positions of the middle dummy memory cells SMC and DMC1 to DMC3 may vary.

Cell strings arranged in the column direction (e.g.,"+Y" direction) may be coupled to one bit line. The first to $m^{th}$ cell strings CS11 to CS1m and CS21 to CS2m arranged in the row direction may be coupled the first to $m^{th}$ bit lines BL1 to BLm, respectively.

Figure 4:
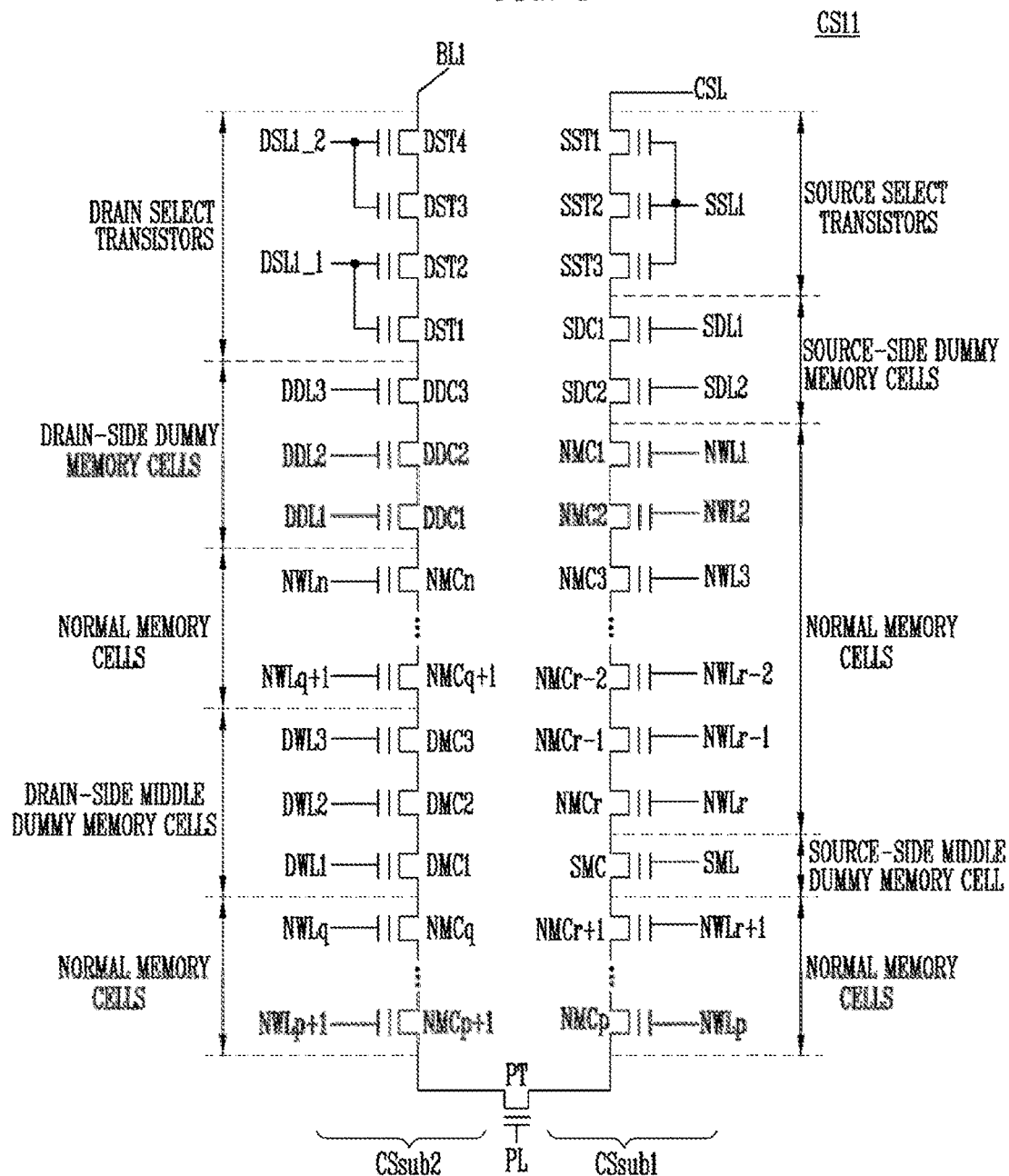
FIG. 4 is a diagram illustrating an example of cell strings of FIG. 3.

FIG. 4 is a diagram illustrating an example of the cell strings CS11 to CS1m and CS21 to CS2m of FIG. 3.

Referring to FIGS. 3 and 4, the cell string CS11 may include the source select transistors SST1 to SST3, the source-side dummy memory cells SDC1 and SDC2, the first to $n^{th}$ normal memory cells NMC1 to NMCn, the middle dummy memory cells SMC and DMC1 to DMC3, the pipe transistor PT, the drain-side dummy memory cells DDC1 to DDC3, and the drain select transistors DST1 to DST4.

The cell string CS11 may include a first sub-cell string CSsub1 and a second sub-cell string CSsub2. The first sub-cell string CSsub1 may include the source select transistors SST1 to SST3, the source-side dummy memory cells SDC1 and SDC2, the first to $p^{th}$ normal memory cells NMC1 to NMCp, and the source-side middle dummy memory cell SMC. The second sub-cell string CSsub2 may include the $(p+1)^{th}$ to $n^{th}$ normal memory cells NMCp+1 to NMCn, the drain-side middle dummy memory cells DMC1 to DMC3, the drain-side dummy memory cells DDC1 to DDC3, and the drain select transistors DST1 to DST4.

The first sub-cell string CSsub1 and the second sub-cell string CSsub2 may be coupled to each other through the pipe transistor PT. The height of the first sub-cell string CSsub1 from the substrate may be substantially equal to the height of the second sub-cell string CSsub2 from the substrate.

According to an embodiment of the present disclosure, the number of the drain-side middle dummy memory cells DMC1 to DMC3 may be greater than the number of the source-side middle dummy memory cells SMC. In addition, the number of the normal memory cells NMCp+1 to NMCn of the second sub-cell string CSsub2 may be smaller than the number of the normal memory cells NMC1 to NMCp of the first sub-cell string CSsub1. In an embodiment, it is possible to maintain electrical characteristics of the second sub-cell string CSsub2 without reducing the number of the normal memory cells NMC1 to NMCn by providing the drain-side middle dummy memory cells DMC1 to DMC3 the number of which is greater than the number of the source-side middle dummy memory cells SMC.

The drain-side middle dummy memory cells DMC1 to DMC3 may be provided at a similar height to the source-side middle dummy memory cell SMC. For example, the source-side middle dummy memory cell SMC may be provided at the same height as any one of the drain-side middle dummy memory cells DMC1 to DMC3. For example, as illustrated in FIG. 4, the source-side middle dummy memory cell SMC may be placed at the same height as the first drain-side middle dummy memory cell DMC1.

Since the number of the drain-side middle dummy memory cells DMC1 to DMC3 is greater than the number of the source-side middle dummy memory cells SMC, at least one of the drain-side middle dummy memory cells DMC1 to DMC3 may be provided at the same height as at least one of the normal memory cells NMC1 to NMCp. For example, as illustrated in FIG. 4, the second and third drain-side middle dummy memory cells DMC2 and DMC3 may be placed at the same height as the $r^{th}$ and $(r-1)^{th}$ normal memory cells NMCr and NMCr-1.

According to an embodiment of the present disclosure, the number of the drain-side dummy memory cells DDC1 to DDC3 may be greater than the number of the source-side dummy memory cells SDC1 and SDC2, and the number of the drain select transistors DST1 to DST4 may be greater than the number of the source select transistors SST1 to SST3. The number of the normal memory cells NMCp+1 to NMCn of the second sub-cell string CSsub2 may be smaller than the number of the normal memory cells NMC1 to NMCp of the first sub-cell string CSsub1. According to an embodiment, it is possible to minimize the leakage of current that may occur through the drain select transistors DST1 to DST4 while maintaining the number of the normal memory cells NMC1 to NMCn by providing a large number of the drain select transistors DST1 to DST4 and the drain-side dummy memory cells DDC1 to DDC3.

In an embodiment, the number of the drain select transistors DST1 to DST4 may be greater by the difference between the number of the source-side dummy memory cells SDC1 and SDC2 and the number of the drain-side dummy memory cells DDC1 to DDC3 than the number of the source select transistors SST1 to SST3. As illustrated in FIG. 4, the number of the source-side dummy memory cells SDC1 and SDC2 may be smaller by one than the number of the drain-side dummy memory cells DDC1 to DDC3, and the number of the drain select transistors DST1 to DST4 may be greater by one than the number of source select transistors SST1 to SST3.

The number of the first to $p^{th}$ normal memory cells NMC1 to NMCp may be greater than the number of the $(p+1)^{th}$ to $n^{th}$ normal memory cells NMCp+1 to NMCn.

In an embodiment, the number of the first to $p^{th}$ normal memory cells NMC1 to NMCp may be greater than the number of the $(p+1)^{th}$ to $n^{th}$ normal memory cells NMCp+1 to NMCn by the sum obtained by adding a value obtained by subtracting the number of the source-side dummy memory cells SDC1 and SDC2 from the number of the drain-side memory dummy cells DDC1 to DDC3, a value obtained by subtracting the number of the source select transistors SST1 to SST3 from the number of the drain select transistors DST1 to DST4, and a value obtained by subtracting the number of the source-side middle dummy memory cells SMC from the number of the drain-side middle dummy memory cells DMC1 to DMC3.

In other words, the sum of the number of the source select transistors SST1 to SST3, the number of the source-side dummy memory cells SDC1 and SDC2, the number of the first to p$^{th}$ normal memory cells NMC1 to NMCp, and the number of the source-side middle dummy memory cells SMC may be equal to the sum of the number of the drain select transistors DST1 to DST4, the number of the drain-side dummy memory cells DDC1 to DDC3, the number of the (p+1)$^{th}$ to n$^{th}$ normal memory cells NMCp+1 to NMCn, and the number of the drain-side middle dummy memory cells DMC1 to DMC3. As a result, the height of the first sub-cell string CSsub1 from the pipe transistor PT can be substantially equal to the height of the second sub-cell string CSsub2 from the pipe transistor PT.

FIG. 5 is a table illustrating examples of voltages applied to row lines coupled to a selected memory block in a program operation of the semiconductor memory device 100. Hereinafter, for convenience of illustration, it is assumed that a program operation is performed on any one page of the cell strings CS21 to CS2m arranged in the second row. The cell strings CS11 to CS1m arranged in the first row are unselected, and the cell strings CS21 to CS2m arranged in the second row are selected.

The first drain select lines DSL1_1 and DSL1_2 are unselected, and the second drain select lines DSL2_1 and DSL2_2 are selected. Referring to FIGS. 3 to 5, the first drain select lines DSL1_1 and DSL1_2 receive first and second drain select line voltages Vdsl1 and Vdsl2. Accordingly, the cell strings CS11 to CS1m arranged in the first row are electrically separated from the bit lines BL1 to BLm.

The first and second drain select line voltages Vdsl1 and Vdsl2 may be voltages used for electrically separating the cell strings CS11 to CS1m arranged in the first row from the bit lines BL1 to BLm. The first and second drain select line voltages Vdsl1 and Vdsl2 may be low voltages. For example, the first and second drain select line voltages Vdsl1 and Vdsl2 may be voltages lower than threshold voltages of the first to fourth drain select transistors DST1 to DST4. For example, the first and second drain select line voltages Vdsl1 and Vdsl2 may be voltages that sequentially increase. For example, the first and second drain select line voltages Vdsl1 and Vdsl2 may be the same voltage. A relatively large number of the drain select transistors DST1 to DST4 may reduce leakage current flowing through the drain select transistors DST1 to DST4 from the unselected cell strings CS11 to CS1m.

The second drain select lines DSL2_1 and DSL2_2 receive a third drain select line voltage Vdsl3. Accordingly, the cell strings CS21 to CS2m arranged in the second row are electrically connected to the bit lines BL1 to BLm. For example, the third drain select line voltage Vdsl3 may be a voltage higher than threshold voltages of the first to fourth drain select transistors DST1 to DST4. The third drain select line voltage Vdsl3 is higher than the first and second drain select line voltages Vdsl1 and Vdsl2.

Accordingly, the cell strings CS11 to CS1m arranged in the first row are electrically separated from the bit lines BL1 to BLm, and the cell strings CS21 to CS2m are electrically connected to the bit lines BL1 to BLm.

The first to third drain-side dummy word lines DDL1 to DDL3 receive third to fifth dummy word line voltage Vdwl3 to Vdwl5, respectively. In an embodiment, the third to fifth dummy word line voltage Vdwl3 to Vdwl5 may be voltages that sequentially decrease. In an embodiment, the third to fifth dummy word line voltage Vdwl3 to Vdwl5 may be the same voltage.

A program voltage Vpgm may be applied to a selected normal word line NWLs among the normal word lines NWL1 to NWLn. A pass voltage Vpass may be applied to unselected normal word lines NWLus among the normal word lines NWL1 to NWLn. Also, the pass voltage Vpass may be applied to middle dummy word lines DML1 to DML3 and SML.

The cell strings CS11 to CS1m arranged in the first string may be electrically separated from the bit lines BL1 to BLm and the common source line CSL, and thus channel layers of the cell strings CS11 to CS1m arranged in the first string may be boosted according to the program voltage Vpgm and the pass voltage Vpass. Accordingly, voltage levels at the channel layers of the cell strings CS11 to CS1m arranged in the first string may increase.

The cell strings CS21 to CS2m arranged in the second row may be electrically connected to the bit lines BL1 to BLm. For example, a reference voltage or power voltage is transmitted through the bit lines BL1 to BLm according to data DATA (see FIG. 1) to be programmed. When the reference voltage is applied to a bit line, the reference voltage may be transmitted to a channel formed in the channel layer of a corresponding cell string. The threshold voltage of a memory cell of the selected normal word line NWLs may be increased according to the difference between the reference voltage and the program voltage Vpgm. The voltage difference between the reference voltage and the pass voltage Vpass is not high enough to change the threshold voltage of the memory cell to different threshold voltage distributions. When the power voltage is applied to a bit line, corresponding drain select transistors DST1 to DST4 may be turned off by the power voltage and the third drain select line voltage Vdsl3 applied to the second drain select lines DSL2_1 and DSL2_2. As a result, a corresponding cell string may be electrically separated from the bit line and the common source line CSL. The channel layer of the corresponding cell string may be boosted by the program voltage Vpgm and the pass voltage Vpass. Accordingly, the voltage levels at the channel layer of the corresponding cell string may increase.

The first and second source-side dummy word lines SDL1 and SDL2 may receive first and second dummy word line voltages Vdwl1 and Vdwl2, respectively. In an embodiment, the first and second dummy word line voltages Vdwl1 and Vdwl2 may be voltages that sequentially increase. In an embodiment, the first and second dummy word line voltages Vdwl1 and Vdwl2 may be the same voltage.

First and second source select line voltages Vssl1 and Vssl2 may be applied to the first and second source select lines SSL1 and SSL2, respectively. For example, the source select transistors SST1 to SST3 of the cell strings CS21 to CS2m arranged in the second row may be turned off by the first source select line voltage Vssl1, and the cell strings CS11 to CS1m arranged in the first row is electrically separated from the common source line CSL. As a result, in the program operation, the cell strings CS11 to CS1m arranged in the first row may be electrically separated from the bit lines BL1 to BLm and the common source line CSL. For example, the source select transistors SST1 to SST3 of the cell strings CS21 to CS2m arranged in the second row may be turned off by the second source select line voltage Vssl2, and the cell strings CS21 to CS2m arranged in the second row may be electrically separated from the common source line. As a result, in the program operation, the cell strings CS21 to CS2m arranged in the second row may be electrically connected to the bit lines BL1 to BLm and electrically separated from the common source line CSL.

Figure 6:
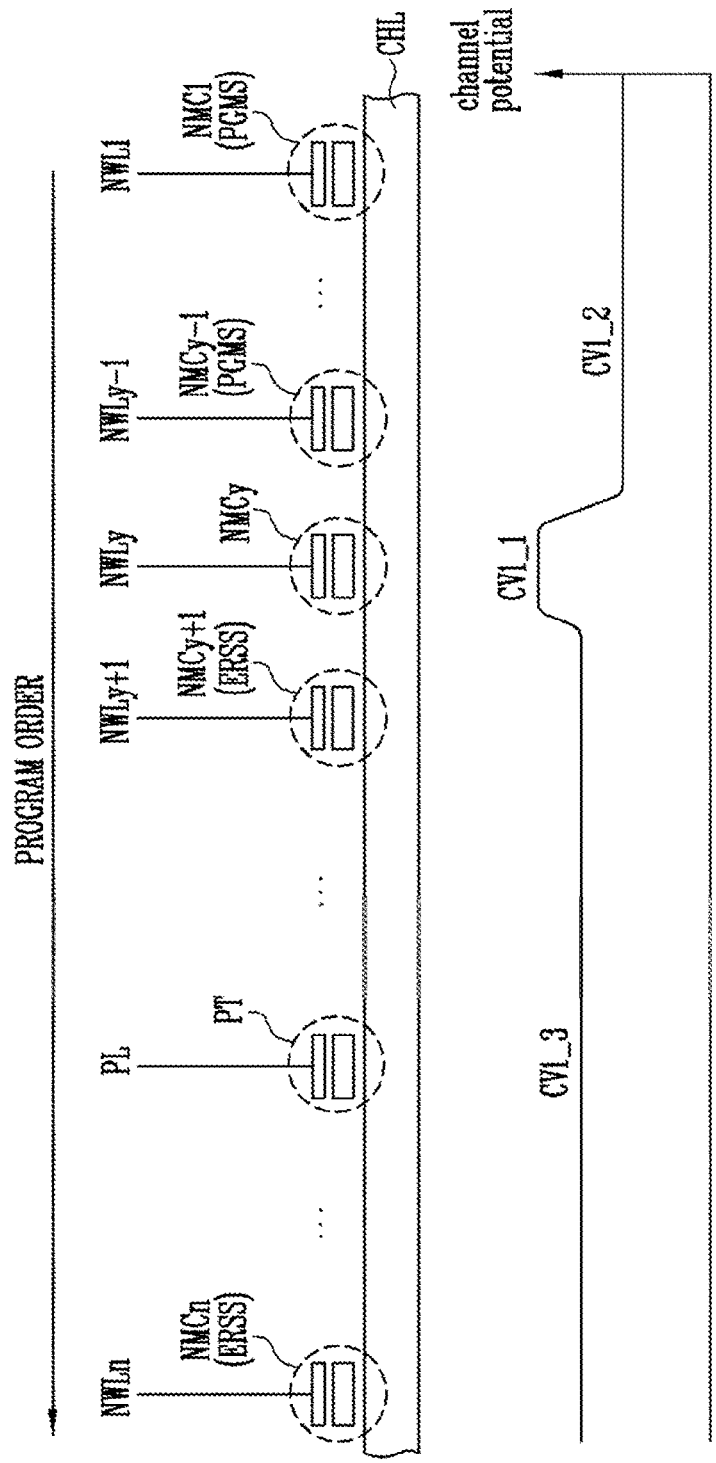
FIG. 6 is a diagram illustrating an example of a potential of a channel layer of an unselected cell string when any one of normal word lines of a first sub-cell string is selected in the program operation.

FIG. 6 is a diagram illustrating an example of a potential of a channel layer of an unselected cell string when any one of normal word lines NWL1 to NWLp of the first sub-cell string CSsub1 is selected in the program operation. In FIG.

6, it is assumed that a $y^{th}$ normal word line NWLy (y is a natural number smaller than p) is selected.

Referring to FIG. 6, program operations on the first to $n^{th}$ normal word lines NWL1 to NWLn may be sequentially performed. Accordingly, at a point in time when a program operation on the $y^{th}$ normal word line NWLy is performed, program operations on first to $(y-1)^{th}$ normal memory cells NMC1 to NMCy−1 have been completed. Thus, each of the first to $(y-1)^{th}$ normal memory cells NMC1 to NMCy−1 may have a programmed state PGMS or an erased state ERSS. Hereinafter, for convenience of illustration, it is assumed that the first to $(y-1)^{th}$ normal memory cells NMC1 to NMCy−1 have the programmed state PGMS. Since program operations on $(y+1)^{th}$ to $n^{th}$ normal memory cells NMCy+1 to NMCn are not performed, the $(y+1)^{th}$ to $n^{th}$ normal memory cells NMCy+1 to NMCn have the erased state ERSS.

The program voltage Vpgm is applied to the $y^{th}$ normal word line NWLy. In FIG. 6, the cell string is an unselected cell string. The voltage of a channel layer CHL of a $y^{th}$ normal memory cell NMCy may be boosted to a relatively high channel voltage CV1_1 according to the high program voltage Vpgm.

The pass voltage Vpass may be applied to the other normal word lines NWL1 to NWLy−1 and NWLy+1 to NWLn. Also, the pass voltage Vpass may be applied to the pipe line PL.

The normal memory cells NMC1 to NMCy−1 between the $y^{th}$ normal memory cell NMCy and the common source line CSL (see FIG. 3) have the programmed state PGMS. Thus, the threshold voltage of each of the normal memory cells NMC1 to NMCy−1 may be a positive voltage. The voltage of the channel layer CHL of the first to $(y-1)^{th}$ normal memory cells NMC1 to NMCy−1 may be boosted to a channel voltage CV1_2 corresponding to the value obtained by subtracting a corresponding positive voltage from the pass voltage Vpass.

Each of the $(y+1)^{th}$ to $n^{th}$ normal memory cells NMCy+1 to NMCn corresponds to the erased state ERSS, and hence its threshold voltage may be a negative voltage. The voltage of the channel layer CHL of the $(y+1)^{th}$ to $n^{th}$ normal memory cells NMCy+1 to NMCn may be boosted to a channel voltage CV1_3 corresponding to the value obtained by subtracting a corresponding negative voltage from the pass voltage Vpass.

The channel voltage CV1_3 formed in the $(y+1)^{th}$ to $n^{th}$ normal memory cells NMCy+1 to NMCn may be higher than the channel voltage formed in the first to $(y-1)^{th}$ normal memory cells NMC1 to NMCy−1.

Figure 7:
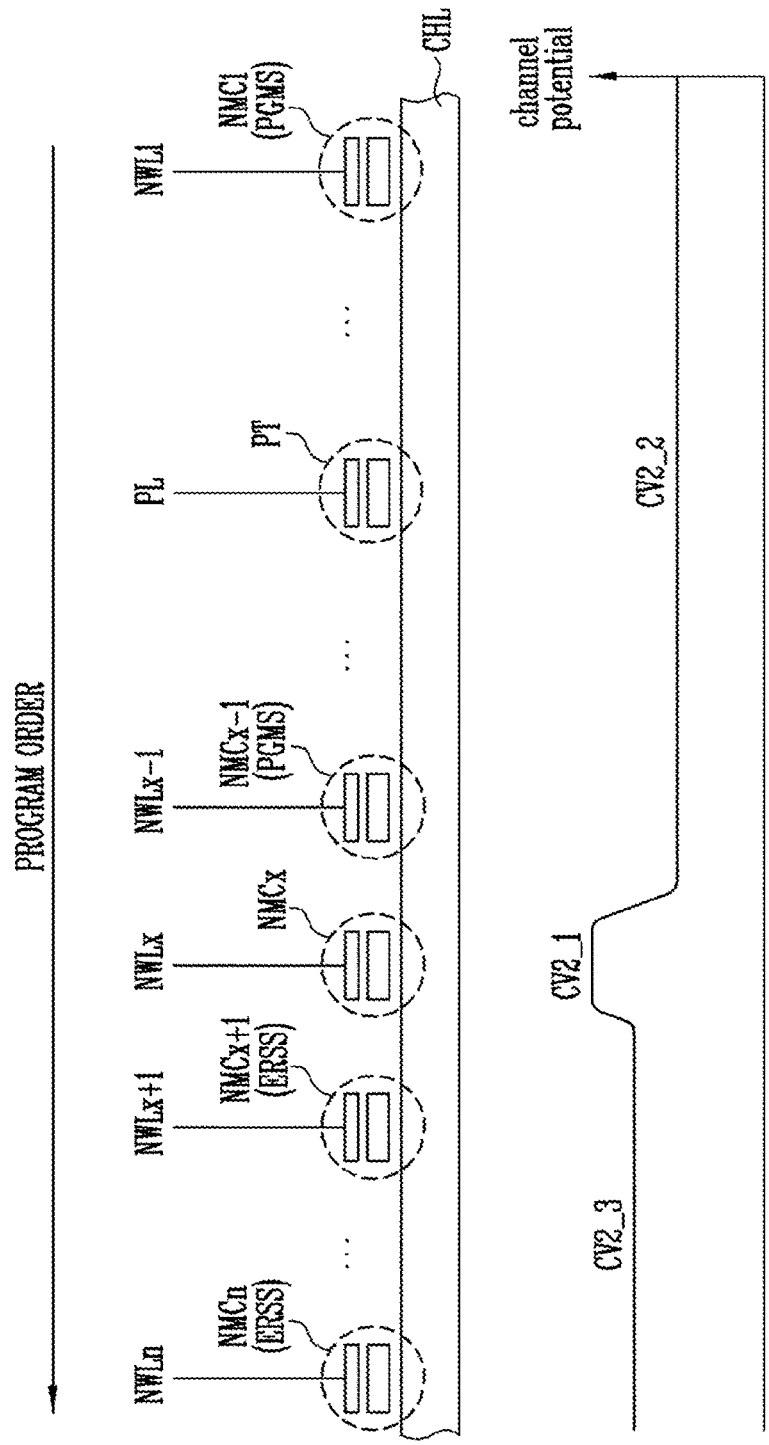
FIG. 7 is a diagram illustrating an example of a potential of a channel layer of an unselected cell string when any one of normal word lines of a second sub-cell string is selected in the program operation.

FIG. 7 is a diagram illustrating an example of a potential of a channel layer of an unselected cell string when any one of normal word lines NWLp+1 to NWLn of the second sub-cell string CSsub2 is selected in the program operation. In description of FIG. 7, it is assumed that an $x^{th}$ normal word line NWLx (x is a natural number greater than p and smaller than n) is selected.

Referring to FIG. 7, program operations on the first to $n^{th}$ normal word lines NWL1 to NWLn are sequentially performed. Accordingly, at a point of time when a program operation on the $x^{th}$ normal word line NWLx is performed, program operations on first to $(x-1)^{th}$ normal memory cells NMC1 to NMCx−1 have been completed. Thus, each of the first to $(x-1)^{th}$ normal memory cells NMC1 to NMCx−1 can have a programmed state PGMS or an erased state ERSS. Hereinafter, for convenience of illustration, it is assumed that the first to $(x-1)^{th}$ normal memory cells NMC1 to NMCx−1 have the programmed state PGMS. Since program operations on $(x+1)^{th}$ to $n^{th}$ normal memory cells NMCx+1 to NMCn are not performed, the $(x+1)^{th}$ to $n^{th}$ normal memory cells NMCx+1 to NMCn may have the erased state ERSS.

The program voltage Vpgm may be applied to the $x^{th}$ normal word line NWLx. In FIG. 7, the cell string is an unselected cell string. The voltage of a channel layer CHL of an $x^{th}$ normal memory cell NMCx may be boosted to a relatively high channel voltage CV2_1 according to the high program voltage Vpgm.

The other normal word lines NWL1 to NWLx−1 and NWLx+1 to NWLn may receive the pass voltage Vpass. Also, the pass voltage Vpass may be applied to the pipe line PL.

The normal memory cells NMC1 to NMCx−1 between the $x^{th}$ normal memory cell NMCx and the common source line CSL (see FIG. 3) have the programmed state PGMS. The voltage of the channel layer CHL of the first to $(x-1)^{th}$ normal memory cells NMC1 to NMCx−1 may be boosted to a channel voltage CV2_2 corresponding to the value obtained by subtracting a threshold voltage of the corresponding normal memory cell from the pass voltage Vpass.

The $(x+1)^{th}$ to $n^{th}$ normal memory cells NMCx+1 to NMCn have the erased state ERSS. Each of the $(x+1)^{th}$ to $n^{th}$ normal memory cells NMCx+1 to NMCn is a negative voltage. The channel layer CHL of the $(x+1)^{th}$ to $n^{th}$ normal memory cells NMCx+1 to NMCn may be boosted to a channel voltage CV2_3 corresponding to the value obtained by subtracting a corresponding negative voltage from the pass voltage Vpass. The channel voltage CV2_3 formed in the $(x+1)^{th}$ to $n^{th}$ normal memory cells NMCx+1 to NMCn is higher than the channel voltage CV2_2 formed in the first to $(x-1)^{th}$ normal memory cells NMC1 to NMCx−1. In other words, the normal memory cells having the erased state ERSS have a higher boosting efficiency than the normal memory cells having the programmed state PGMS.

As illustrated in FIGS. 6 and 7, as the program operations are performed, the number of normal memory cells having the programmed state PGMS may increase. As the program operations are performed, the channel layer CHL may be boosted to a relatively low voltage. As the voltage level at the channel layer CHL is excessively decreased even with a small leakage current, the voltage difference between normal word lines and the channel layer CHL may increase, and, as a result, the threshold voltage of a corresponding normal memory cell may unintentionally increase.

As the program operations are performed, the number of normal memory cells having the erased state ERSS in the cell string may decrease. This means that the area boosted to a relatively high voltage is reduced in the channel layer CHL. The area (area corresponding to NMCx+1 to NMCn) boosted to a relatively high voltage in the channel layer CHL of FIG. 7 is smaller than the area (area corresponding to NMCy+1 to NMCn) boosted to a relatively high voltage in the channel layer CHL of FIG. 6. If channels of only a small number of normal memory cells are boosted to a high voltage, a corresponding channel capacitance is relatively small, and thus the voltage level at the corresponding channel layer CHL may change considerably, which may deteriorate the reliability of the program operation. If channels of only a small number of normal memory cells are boosted to a high voltage, relatively small channel capacitances may allow the voltage level of the corresponding channel layer CHL to be easily influenced by the program voltage Vpgm, which may cause a change in the voltage level of the corresponding channel layer CHL.

As a result, normal word lines of the second sub-cell string CSsub2 may be more vulnerable to disturbance than normal word lines of the first sub-cell string CSsub1.

According to an embodiment of the present disclosure, the number of the drain-side middle dummy memory cells DMC1 to DMC3 (see FIG. 3) is greater than the number of the source-side middle dummy memory cells SMC (see FIG. 3). Accordingly, it is possible to provide improved reliability when the program operation is performed on the normal word lines of the second sub-cell string CSsub2.

According to an embodiment of the present invention, the number of the drain-side dummy memory cells DDC1 to DDC3 (see FIG. 3) is greater than the number of the source-side dummy memory cells SDC1 and SDC2 (see FIG. 3), and the number of the drain select transistors DST1 to DST4 (see FIG. 3) is greater than the number of the source select transistors SST1 to SST3 (see FIG. 3). Accordingly, it is possible to provide improved reliability when the program operation is performed on the normal word line of the second sub-cell string CSsub2.

Figure 8:
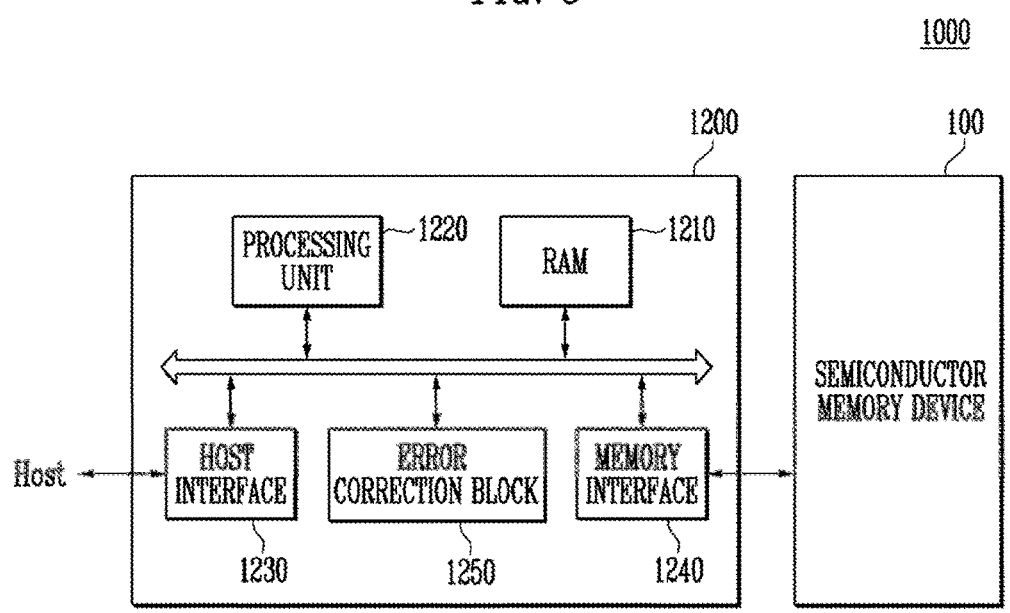
FIG. 8 is a diagram illustrating an example of a memory system including the semiconductor memory device of FIG. 1.

FIG. 8 is a diagram illustrating an example of a memory system 1000 including the semiconductor memory device 100 of FIG. 1.

Referring to FIG. 8, the memory system 1000 may include a semiconductor memory device 100 and a controller 1200.

The semiconductor memory device 100 may be configured and operated as described with reference to FIG. 1. Hereinafter, overlapping descriptions will be omitted.

The controller 1200 may be coupled to a host Host and the semiconductor memory device 100. The controller 1200 may access the semiconductor memory device 100 in response to a request from the host Host. For example, the controller 1200 may control read, write, erase, and background operations of the semiconductor memory device 100. The controller 1200 may provide an interface between the semiconductor memory device 100 and the host Host. The controller 1200 may drive firmware for controlling the semiconductor memory device 100.

The controller 1200 may include a random access memory (RAM) 1210, a processing unit 1220, a host interface 1230, a memory interface 1240, and an error correction block 1250.

The RAM 1210 may be used as at least one of an operation memory of the processing unit 1220, a cache memory between the semiconductor memory device 100 and the host Host, and a buffer memory between the semiconductor memory device 100 and the host Host.

The processing unit 1220 may control overall operations of the controller 1200.

The host interface 1230 may include a protocol for exchanging data between the host Host and the controller 1200. In an embodiment, the controller 1200 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1240 interfaces with the semiconductor memory device 100. For example, the memory interface 1240 may include a NAND interface or a NOR interface.

The error correcting block 1250 may detect and correct errors of data received from the semiconductor memory device 100 by using an error correction code (ECC).

The controller 1200 and the semiconductor memory device 100 may be integrated into one semiconductor device. In an embodiment, the controller 1200 and the semiconductor memory device 100 may be integrated into one semiconductor device to constitute a memory card. For example, the controller 1200 and the semiconductor memory device 100 may be integrated into one semiconductor device to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1200 and the semiconductor memory device 100 may be integrated into one semiconductor device to constitute a solid state drive (SSD). The semiconductor drive SSD includes a storage device which may store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

As an embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 9:
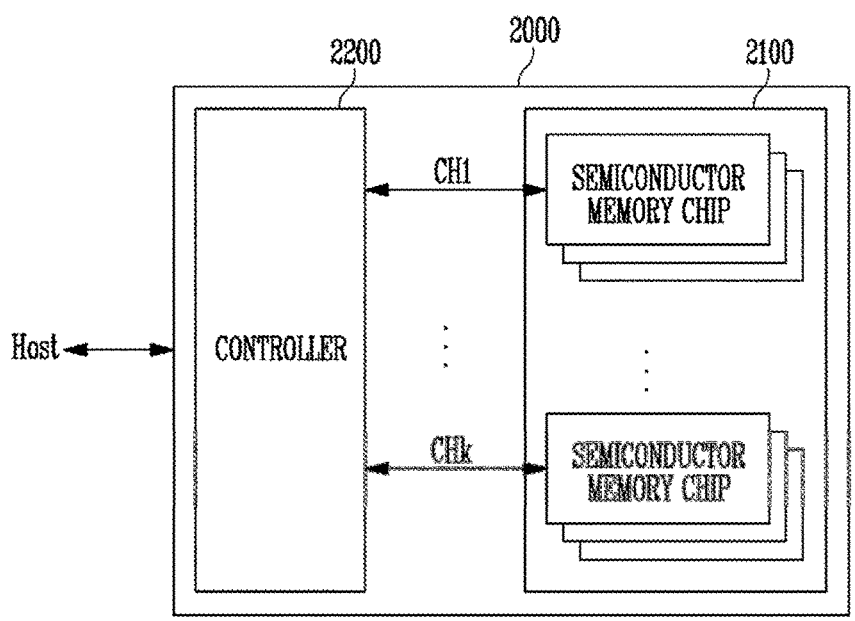
FIG. 9 is a diagram illustrating an application example of the memory system of FIG. 8.

FIG. 9 is a diagram illustrating an application example 2000 of the memory system 1000 of FIG. 8.

Referring to FIG. 9, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 9, it is illustrated that the plurality of groups communicates with the controller 2200 through first to $k^{th}$ channels CH1 to CHk. Each semiconductor memory chip may be configured and operated like the semiconductor memory device 100 described with reference to FIG. 1.

Each group may communicate with the controller 2200 through one common channel. The controller 2200 may be configured similarly to the controller 1200 described with reference to FIG. 8. The controller 2200 may control the plurality of memory chips of the semiconductor memory device 2100 by providing control signals and receiving data through the plurality of channels CH1 to CHk.

In FIG. 9, it is illustrated that a plurality of semiconductor memory chips are coupled to one channel. However, it will be understood that the memory system 2000 may be modified such that one semiconductor memory chip is coupled to one channel.

Figure 10:
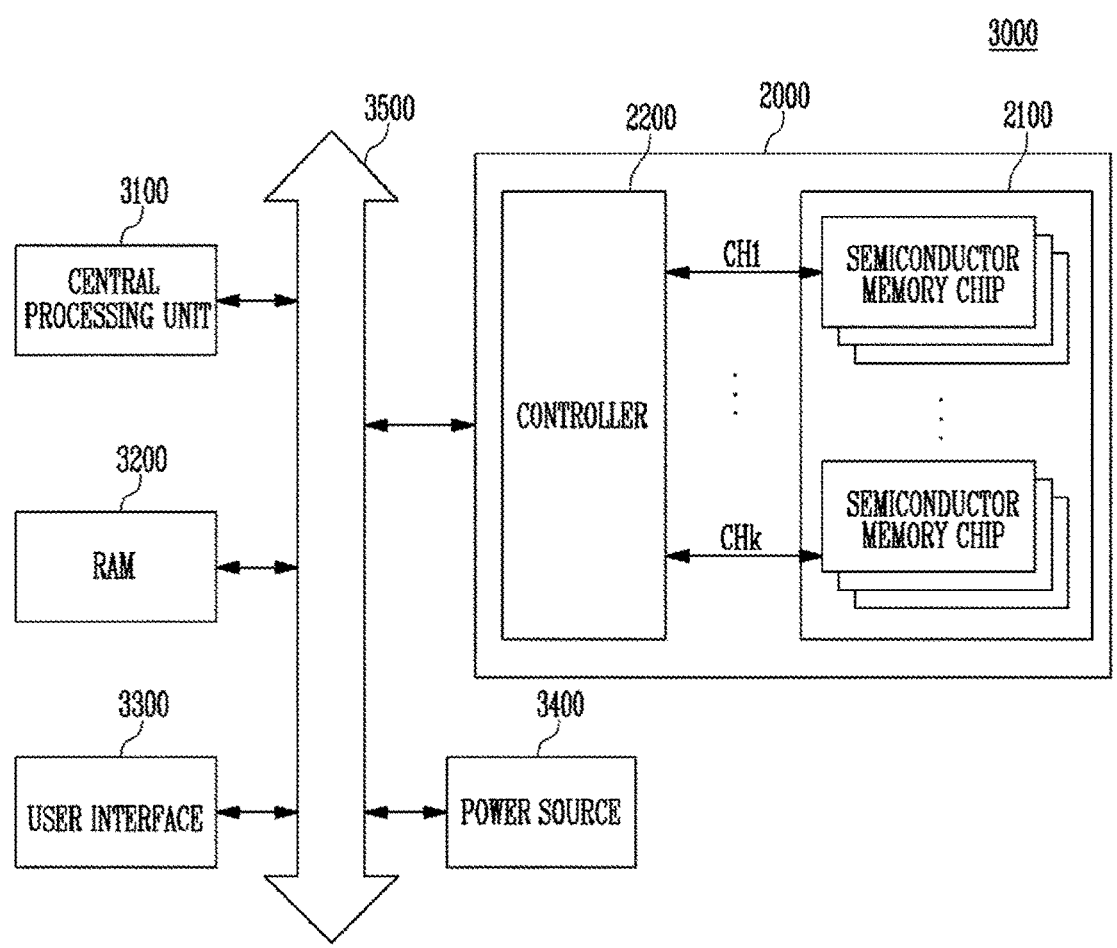
FIG. 10 is a diagram illustrating an example of a computing system including the memory system illustrated in FIG. 9.

FIG. 10 is a diagram illustrating an example of a computing system 3000 including the memory system 2000 described with reference to FIG. 9.

Referring to FIG. 10, the computing system 300 may include a central processing unit 3100, a RAM 3200, a user interface 3300, a power source 3400, a system bus 3500, and a memory system 2000.

The memory system 2000 may be electrically connected to the central processing unit 3100, the RAM 3200, the user interface 3300, and the power source 3400 through the system bus 3500. Data supplied through user interface 3300 or data processed by the central processing unit 3100 may be stored in the memory system 2000.

In FIG. 10, it is illustrated that the semiconductor memory device 2100 may be connected to the system bus 3500 through the controller 2200. However, the semiconductor memory device 2100 may be directly connected to the system bus 3500. In this case, the function of the controller 2200 may be performed by the central processing unit 3100 and the RAM 3200.

In FIG. 10, the memory system 2000 described with reference to FIG. 9 is provided. However, the memory system 2000 may be replaced by the memory system 1000 described with reference to FIG. 8. In an embodiment, the computing system 3000 may include both the memory systems 1000 and 2000 described with reference to FIGS. 8 and 9.

According to the present disclosure, the number of the drain-side middle dummy memory cells is greater than the number of the source-side middle dummy memory cells. Accordingly, it is possible to provide a semiconductor memory device having improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device, comprising:
   a first sub-cell string having source select transistors coupled to a common source line at an end of the first sub-cell string, first normal memory cells coupled to the source select transistors, second normal memory cells and at least one source-side middle dummy memory cell coupled between the first normal memory cells and the second normal memory cells; and
   a second sub-cell string having drain select transistors coupled to a bit line at an end of the second sub-cell string, third normal memory cells coupled to the drain select transistors, fourth normal memory cells and drain-side middle dummy memory cells coupled between the third normal memory cells and the fourth normal memory cells,
   wherein the number of the drain-side middle dummy memory cells continuously disposed between the third normal memory cells and the fourth normal memory cells is greater than the number of the at least one source-side middle dummy memory cell disposed between the first normal memory cells and the second normal memory cells.

2. The semiconductor memory device of claim 1, further comprising a pipe transistor coupling the other end of the first sub-cell string and the other end of the second sub-cell string.

3. The semiconductor memory device of claim 2, wherein, if the first and second sub-cell strings are vertical strings, the height of the first sub-cell string from the pipe transistor is equal to the height of the second sub-cell string from the pipe transistor.

4. The semiconductor memory device of claim 2, wherein:
   the first normal memory cells are coupled between the common source line and the at least one source-side middle dummy memory cell;
   the second normal memory cells are coupled between the pipe transistor and the at least one source-side middle dummy memory cell; and
   if the first and second sub-cell strings are vertical strings, at least one of the drain-side middle dummy memory cells is placed at the same or substantially the same height as at least one of the first normal memory cells.

5. The semiconductor memory device of claim 1, wherein a sum of the number of the first normal memory cells and the number of the second normal memory cells is greater than a sum of the number of the third normal memory cells and the number of the fourth normal memory cells.

6. The semiconductor memory device of claim 1, wherein, if the first and second sub-cell strings are vertical strings, at least one of the drain-side middle dummy memory cells is placed at the same or substantially the same height as at least one of the first normal memory cells.

7. The semiconductor memory device of claim 1, wherein, if the first and second sub-cell strings are vertical strings, the at least one source-side middle dummy memory cell is placed at the same or substantially the same height as any one of the drain-side middle dummy memory cells.

8. The semiconductor memory device of claim 1, wherein:
   the first normal memory cells are coupled in series;
   the second normal memory cells are coupled in series;
   the third normal memory cells are coupled in series; and
   the fourth normal memory cells are coupled in series.

9. The semiconductor memory device of claim 8, further comprising a pipe transistor coupling the other end of the first sub-cell string and the other end of the second sub-cell string,
   wherein:
   the first normal memory cells are coupled between the common source line and the at least one source-side middle dummy memory cell;

the second normal memory cells are coupled between the pipe transistor and the at least one source-side middle dummy memory cell; and if the first and second sub-cell strings are vertical strings, at least one of the drain-side middle dummy memory cells is placed at the same or substantially the same height as at least one of the second normal memory cells.

10. The semiconductor memory device of claim 1, wherein:

the number of the source-side dummy memory cells is smaller than the number of the drain-side dummy memory cells; and the number of the drain select transistors is greater than the number of the source select transistors.

11. The semiconductor memory device of claim 10, wherein:

the number of the source-side dummy memory cells is smaller by a predetermined value than the number of the drain-side dummy memory cells; and the number of the drain select transistors is greater than the predetermined value than the number of the source select transistors.

12. The semiconductor memory device of claim 10, wherein a sum of the number of the first normal memory cells and the number of the second memory cells is greater than a sum of the number of the third normal memory cells and the fourth normal memory cells by a value obtained by adding a difference between the number of the drain-side dummy memory cells and the number of the source-side dummy memory cells, a difference between the number of the drain select transistors and the number of the source select transistors, and a difference between the number of the drain-side middle dummy memory cells and the number of the at least one source-side middle dummy memory cell.

13. The semiconductor memory device of claim 10, wherein the sum of the number of the source select transistors, the number of the source-side dummy memory cells, the number of the first normal memory cells, the number of the second normal memory cells, and the number of the source-side middle dummy memory cells is equal to the sum of the number of the drain select transistors, the number of the drain-side dummy memory cells, the number of the third normal memory cells, the number of the fourth normal memory cells, and the drain-side middle dummy memory cells.

14. A memory system, comprising:

a controller providing control signals through a plurality of channels; and a semiconductor memory device including first and second sub-cell strings, the first sub-cell string having source select transistors coupled to a common source line, first normal memory cells coupled to the source select transistors, second normal memory cells and at least one source-side middle dummy memory cell coupled between the first normal memory cells and the second normal memory cells, the second sub-cell string having drain select transistors coupled to a bit line, third normal memory cells coupled to the drain select transistors, fourth normal memory cells and drain-side middle dummy memory cells coupled between the third normal memory cells and the fourth normal memory cells, the number of the drain-side middle dummy memory cells continuously disposed between the third normal memory cells and the fourth normal memory cells being greater than the number of the at least one source-side middle dummy memory cell disposed between the first normal memory cells and the second normal memory cells.

15. The memory system of claim 14, further comprising a pipe transistor coupling the first sub-cell string and the second sub-cell string.

16. The memory system of claim 14, wherein a sum of the number of the first normal memory cells and the second normal memory cells is greater than a sum of the number of the third normal memory cells and the fourth normal memory cells.

17. The memory system of claim 14, wherein:

the first normal memory cells are coupled in series;

the second normal memory cells are coupled in series;

the at least one source-side middle dummy memory cell is coupled in series between the first normal memory cells and the second normal memory cells;

the third normal memory cells are coupled in series;

the fourth normal memory cells are coupled in series; and the drain-side middle dummy memory cells are coupled in series between the third normal memory cells and the fourth normal memory cells.

18. The memory system of claim 14, wherein:

the number of the source-side dummy memory cells is smaller than the number of the drain-side dummy memory cells; and the number of the drain select transistors is greater than the number of the source select transistors.

19. The memory system of claim 18, wherein:

the number of the source-side dummy memory cells is smaller by a predetermined value than the number of the drain-side dummy memory cells; and the number of the drain select transistors is greater than the predetermined value than the number of the source select transistors.

* * * * *